US012628407B2

(12) United States Patent
Zhang et al.

(10) Patent No.: US 12,628,407 B2
(45) Date of Patent: May 12, 2026

(54) RADIO FREQUENCY DEVICE AND RADIO FREQUENCY FRONT-END APPARATUS

(71) Applicant: XIAMEN SAN'AN INTEGRATED CIRCUIT CO., LTD., Xiamen (CN)

(72) Inventors: Yongming Zhang, Xiamen (CN); Wenbi Cai, Xiamen (CN); Yang Wu, Xiamen (CN); Yishu Lin, Xiamen (CN); Peng Wang, Xiamen (CN); Shinichiro Takatani, Xiamen (CN)

(73) Assignee: XIAMEN SAN'AN INTEGRATED CIRCUIT CO., LTD., Xiamen (CN)

( * ) Notice: Subject to any disclaimer, the term of this patent is extended or adjusted under 35 U.S.C. 154(b) by 377 days.

(21) Appl. No.: 18/450,211

(22) Filed: Aug. 15, 2023

(65) Prior Publication Data

US 2023/0387232 A1 Nov. 30, 2023

Related U.S. Application Data

(63) Continuation-in-part of application No. PCT/CN2021/105279, filed on Jul. 8, 2021.

(30) Foreign Application Priority Data

Feb. 18, 2021 (CN) .......................... 202110187435.1

(51) Int. Cl.
*H10D 64/20* (2025.01)
*H10D 64/23* (2025.01)
*H10D 64/27* (2025.01)
(52) U.S. Cl.
CPC ......... *H10D 64/519* (2025.01); *H10D 64/258* (2025.01)

(58) Field of Classification Search
CPC .. H10D 30/471; H10D 30/472; H10D 30/473; H10D 30/4732; H10D 30/474;
(Continued)

(56) References Cited

U.S. PATENT DOCUMENTS 5,313,083 A 5/1994 Schindler
7,982,243 B1 * 7/2011 Iversen ................ H10D 64/411
257/202
(Continued)

FOREIGN PATENT DOCUMENTS

CN 108630677 A 10/2018
CN 110890426 A 3/2020
(Continued)

*Primary Examiner* — Eric A. Ward
(74) *Attorney, Agent, or Firm* — MUNCY, GEISSLER, OLDS & LOWE, P.C.

(57) ABSTRACT

A radio frequency device includes a substrate, an epitaxial structure, a first electrode, a second electrode, a gate structure, a metal bulk, an auxiliary metal bulk, and a metal connection line. The first/second electrode includes a first/second electrode body and first/second electrode fingers. The gate structure includes a sub-gate having parallel portions and vertical portions alternately connected to one another in series to form a serpentine shape. The auxiliary metal bulk is arranged between corresponding adjacent two parallel portions and between a corresponding vertical portion and an end of a corresponding first electrode finger. The metal bulk is arranged between the auxiliary metal bulk and the vertical portion corresponding to the auxiliary metal bulk. The metal connection line connects the metal bulk to the second electrode body and is insulated from the sub-gate. A radio frequency front-end apparatus including the radio frequency device is also disclosed.

20 Claims, 12 Drawing Sheets

(58) Field of Classification Search
CPC ........... H10D 30/4735; H10D 30/4738; H10D
30/475; H10D 30/4755; H10D 30/476;
H10D 30/477; H10D 30/478; H10D
62/126; H10D 62/127; H10D 62/8503;
H10D 64/257; H10D 64/411; H10D
64/517; H10D 64/518; H10D 64/519;
H10D 89/10; H10D 89/105
See application file for complete search history.

(56) References Cited

U.S. PATENT DOCUMENTS

| | | | | |
|---|---|---|---|---|
| 2006/0237750 | A1* | 10/2006 | Oakes .................. | H10D 64/257 |
| | | | | 257/E29.12 |
| 2011/0294444 | A1* | 12/2011 | Kawano ............... | H10D 62/824 |
| | | | | 257/365 |
| 2012/0211802 | A1* | 8/2012 | Tamari ................. | H10D 62/127 |
| | | | | 257/E29.246 |
| 2012/0299095 | A1* | 11/2012 | Hashimoto .......... | H10D 64/519 |
| | | | | 257/E29.256 |
| 2017/0250725 | A1* | 8/2017 | Wei ....................... | H03F 3/1935 |
| 2018/0356296 | A1* | 12/2018 | Roig-Guitart ........ | H10D 64/257 |

FOREIGN PATENT DOCUMENTS

| | | |
|---|---|---|
| CN | 111627900 A | 9/2020 |
| CN | 112992893 A | 6/2021 |

* cited by examiner

RADIO FREQUENCY DEVICE AND RADIO FREQUENCY FRONT-END APPARATUS

CROSS-REFERENCE TO RELATED APPLICATION

This application is a bypass continuation-in-part application of International Application No. PCT/CN2021/105279 filed on Jul. 8, 2021, which claims priority of Chinese Patent Application No. 202110187435.1, filed on Feb. 18, 2021. The entire content of each of the international and Chinese patent applications is incorporated herein by reference.

FIELD

The disclosure relates to a radio frequency device and a radio frequency front-end apparatus.

BACKGROUND

In the field of radio frequency microwave communications, a transmitter/receiver (TX/RX) module is utilized for multi-mode multi-frequency signal transmission and reception. The TX/RX module is configured to transmit high-power radio frequency signals emitted from front-end modules (FEMs) in a TX mode, and to receive incoming low-power radio frequency signals from antennas in an RX mode. When combined with the front-end modules and the antennas, the TX/RX module may achieve signal transmission and reception. In the TX/RX module, a switch device plays a crucial role. The isolation, insertion loss, and power handling capability of the switch device directly affect the signal transmission and reception performance of the TX/RX module. If the switch device has low power handling capability, the TX/RX module may bear a higher risk of signal leakage during operation. For example, as shown in FIGS. 1 and 2, the leakage as indicated by the dotted arrows happens during signal reception and transmission.

A conventional TX/RX radio frequency device may include a single-gate structure or a multi-gate structure. A layout structure of a multi-gate radio frequency device, as shown in FIG. 3, is usually employed. Compared to a single-gate radio frequency device, the multi-gate radio frequency device has a more compact structure and lower insertion loss. A schematic diagram of a circuit of the multi-gate radio frequency device is shown in FIG. 4. However, in the multi-gate radio frequency device, gate voltages in both side regions and a middle region of a gate structure are variable, that is, these gate voltages are not set at fixed values. During the transmission of high-power signals, the input power impacts the gate voltage in the middle region of the gate structure, causing it to fluctuate. Consequently, the off-state of the gate structure in the multi-gate radio frequency device becomes unstable, leading to an increase in leakage power from a channel layer of the multi-gate radio frequency device and a decrease in power handling capacity of the multi-gate radio frequency device.

In order to address the gate voltage fluctuations with the input power of the multi-gate radio frequency device when transmitting high-power signals, the existing art teaches to provide Rds resistors with large resistances that connect area(s) between two gates and the input and output ports of the device. As shown in FIG. 5, resistors Rds1, Rds2, and Rds3 within the dashed box are designed to stabilize the voltage between the gates. However, such a design requires a significant amount of layout space for these resistors Rds, which increases the cost of the multi-gate radio frequency device.

SUMMARY

Therefore, an object of the disclosure is to provide a radio frequency device that may alleviate at least one of the drawbacks of the prior art, improve the performance of the radio frequency device during off-bias while improving the compactness of the device, thereby saving layout space.

According to the first aspect of the disclosure, a radio frequency device includes: a substrate, an epitaxial structure, a first electrode formed on the epitaxial structure, a second electrode formed on the epitaxial structure, a gate structure, a first metal bulk formed on the epitaxial structure, a first auxiliary metal bulk formed on the epitaxial structure, and a first metal connection line. The epitaxial structure includes a buffer layer, a channel layer, and a barrier layer that are disposed on the substrate in such order. The first electrode includes a first electrode body and a plurality of parallel, spaced-apart first electrode fingers each extending in a first direction and connected to the first electrode body. The second electrode includes a second electrode body and a plurality of parallel, spaced-apart second electrode fingers each extending in the first direction and connected to the second electrode body. The first electrode body and the second electrode body being oppositely arranged in the first direction, the first electrode fingers and the second electrode fingers being interdigitated between the first electrode body and the second electrode body to form a serpentine channel therebetween. The gate structure including a first sub-gate that is formed on the epitaxial structure, that is disposed between the first electrode and the second electrode, and that has multiple first parallel portions each extending in the first direction and multiple first vertical portions each extending in a second direction perpendicular to the first direction, the first parallel portions and the first vertical portions being alternately connected to one another in series to form a serpentine shape and extending in the serpentine channel. The first metal connection line electrically connects the first metal bulk to the second electrode body and is electrically insulated from the first sub-gate. The first auxiliary metal bulk and the first metal bulk are arranged between corresponding adjacent two of the first parallel portions of the first sub-gate and between a corresponding one of the first vertical portions that interconnects the corresponding adjacent two of the first parallel portions and an end of a corresponding one of the first electrode fingers that is surrounded by the corresponding adjacent two of the first parallel portions and the corresponding one of first vertical portions, the end of the corresponding one of the first electrode fingers being distal from the first electrode body. The first metal bulk is positioned between the first auxiliary metal bulk and the corresponding one of the first vertical portions. One of the first electrode and the second electrode serves as a drain electrode and the other as a source electrode.

According to the second aspect of the disclosure, a radio frequency front-end apparatus includes the aforesaid radio frequency device.

In contrast to the prior art, the radio frequency device of the present disclosure provides a channel resistance generated within the epitaxial structure, that functions as the Rds resistors for stabilizing the voltages within the gate structures and that is embedded within the radio frequency device, thus saving layout space. On the other hand, the radio frequency device according to the present disclosure not only has a reduced layout space, but also has the advantages of reduced overall cost and improved performance in regard to the power handling capability, P1dB and isolation.

BRIEF DESCRIPTION OF THE DRAWINGS

Other features and advantages of the disclosure will become apparent in the following detailed description of the embodiment(s) with reference to the accompanying drawings. It is noted that various features may not be drawn to scale.

DETAILED DESCRIPTION

Figure 1:
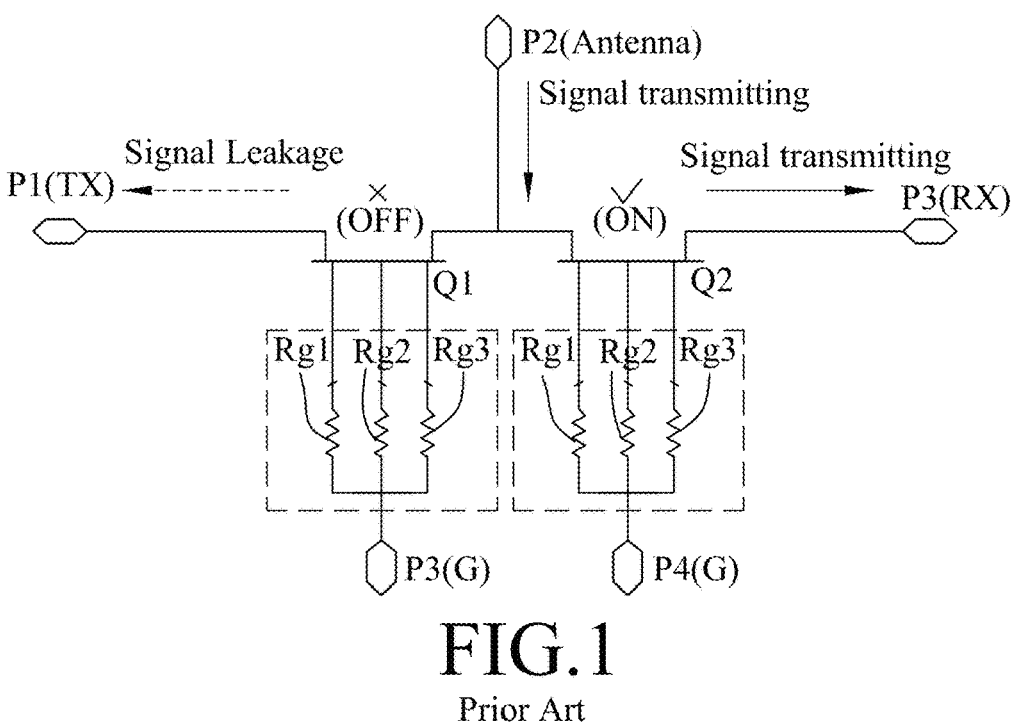
FIG. 1 is a schematic diagram illustrating signal leakage of a conventional TX/RX module, which includes a switch device having a low power handling capability, when the TX/RX module operates in RX mode.
Figure 2:
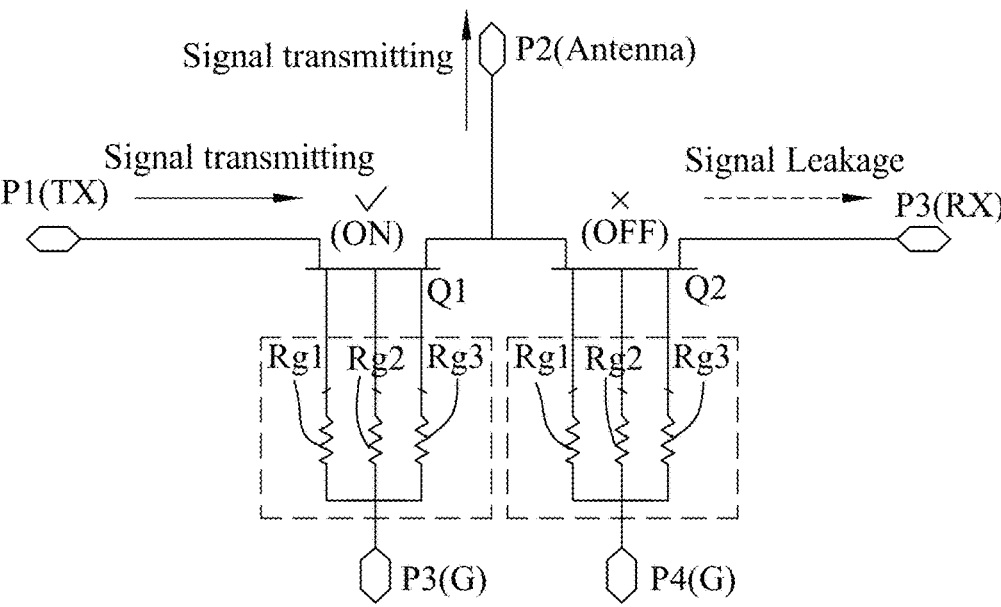
FIG. 2 is a schematic diagram illustrating signal leakage of a conventional switch device, which includes a switch device having a low power handling capability, when the TX/RX module operates in TX mode.

Before the disclosure is described in greater detail, it should be noted that where considered appropriate, reference numerals or terminal portions of reference numerals have been repeated among the figures to indicate corresponding or analogous elements, which may optionally have similar characteristics.

It should be noted herein that for clarity of description, spatially relative terms such as "top," "bottom," "upper," "lower," "on," "above," "over," "downwardly," "upwardly" and the like may be used throughout the disclosure while making reference to the features as illustrated in the drawings. The features may be oriented differently (e.g., rotated 90 degrees or at other orientations) and the spatially relative terms used herein may be interpreted accordingly.

Figure 6:
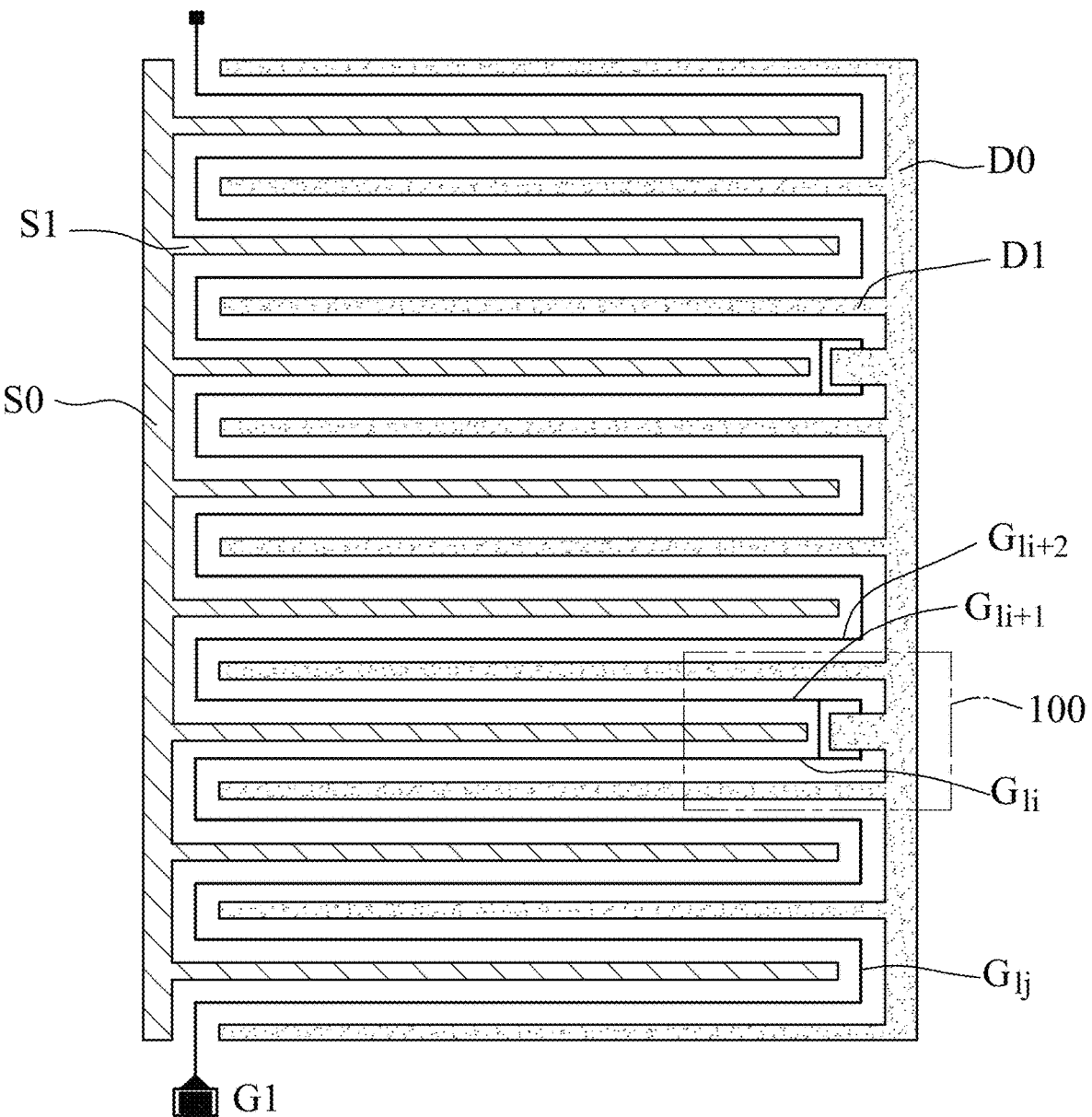
FIG. 6 is a schematic diagram illustrating a first embodiment of an RF device according to the present disclosure.
Figures 7, 8:
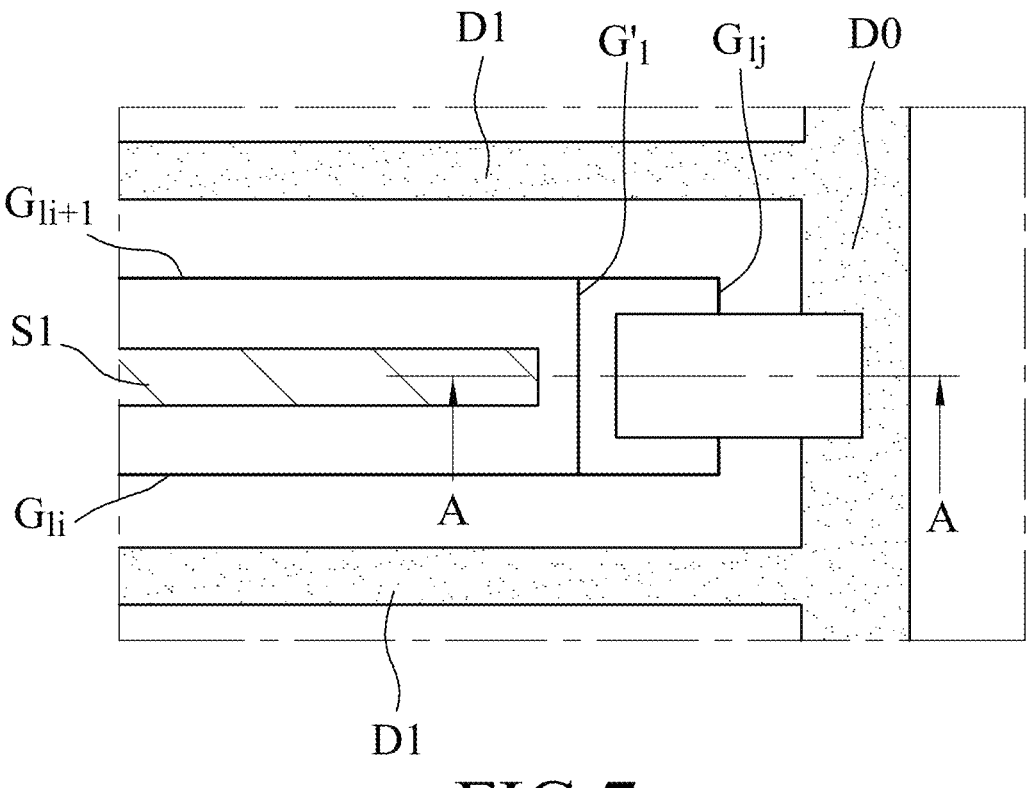
FIG. 7 is an enlarged schematic view of a portion 100 shown in FIG. 6.
FIG. 8 is a schematic sectional view taken along line A-A in FIG. 7.

FIGS. 6 to 8 illustrates a first embodiment of a radio frequency (RF) device according to the present disclosure, which is a single-gate radio frequency device and includes an RF device layout structure as shown in FIGS. 6 and 7. In certain embodiments, the radio frequency (RF) device may be a radio frequency (RF) switch device. The RF device according to the present disclosure includes: a substrate 10; an epitaxial structure having a buffer layer 40, a channel layer 20, and a barrier layer 30 that are disposed on the substrate 10 in such order; a first electrode formed on the epitaxial structure, a second electrode formed on the epitaxial structure, and a gate structure formed on the epitaxial structure.

In the present disclosure, one of the first electrode and the second electrode may serve as a source electrode, and the other may serve as a drain electrode. In the following embodiments, the first electrode serves as the source electrode and the second electrode serves as the drain electrode.

As shown in FIG. 6, the source electrode includes a source electrode body (S0) and a plurality of parallel, spaced-apart source electrode fingers (S1) each extending in a first direction and connected to the source electrode body (S0).

As shown in FIG. 6, the drain electrode includes a drain electrode body (D0) and a plurality of parallel, spaced-apart drain electrode fingers (D1) each extending in the first direction and connected to the drain electrode body (D0).

The source electrode body (S0) and the drain electrode body (D0) are oppositely arranged in the first direction. The source electrode fingers (S1) and the drain electrode fingers (D1) are interdigitated between the source electrode body (S0) and the drain electrode body (D1) to form a serpentine channel therebetween. In certain embodiments, the source electrode fingers (S1) are evenly spaced apart from one another, and the drain electrode fingers (D1) are evenly spaced apart from one another.

In this embodiment, the gate structure includes a sub-gate (G1) formed on the epitaxial structure. As shown in FIG. 6, the sub-gate (G1) is disposed between the source electrode and the drain electrode, and has multiple parallel portions $(G_{1i}, G_{1i+1}, G_{1i+2} \ldots)$ each extending in the first direction and multiple vertical portions $(G_{1j})$ each extending in a second direction perpendicular to the first direction. The parallel portions $(G_{1i}, G_{1i+1}, G_{1i+2} \ldots)$ and the vertical portions $(G_{1j})$ of the sub-gate (G1) are alternately connected to one another in series to form a serpentine shape and extend in the serpentine channel.

As shown in FIGS. 7 and 8, the radio frequency device of this embodiment further includes a first metal bulk $(M_1)$ and a first auxiliary metal bulk $(G'_1)$ both formed on the epitaxial structure. The first auxiliary metal bulk $(G'_1)$ and the first metal bulk $(M_1)$ are arranged between corresponding adjacent two of the first parallel portions $(G_{1i}, G_{1i+1})$ of the sub-gate (G1). The first auxiliary metal bulk $(G'_1)$ has two opposite ends that are located oppositely in the second direction and respectively connected to the corresponding adjacent two of the first parallel portions $(G_{1i}, G_{1i+1})$ of the sub-gate (G1). The corresponding adjacent two first parallel portions ($G_{1i}$, $G_{1i+1}$) of the sub-gate (G1) and a corresponding one of the vertical portions ($G_{1j}$) that interconnects the corresponding adjacent two of the first parallel portions ($G_{1i}$, $G_{1i+1}$) surround a corresponding one of the source electrode fingers (S1). The first auxiliary metal bulk ($G'_1$) is arranged between the corresponding vertical portion ($G_{1j}$) and an end of the corresponding source electrode finger (S1) that is distal from the source electrode body (S0).

As shown in FIG. 8, the first metal bulk ($M_1$) is positioned between the first auxiliary metal bulk ($G'_1$) and the corresponding one of the vertical portions ($G_{1j}$), and is electrically connected by a first metal connecting line (L1) to the drain electrode body (D0) and electrically insulated from the sub-gate (G1).

Moreover, the corresponding one of the vertical portions ($G_{1j}$) of the sub-gate (G1) is isolated from the first metal connecting line (L1) by air. Alternatively, the corresponding one of the vertical portions ($G_{1j}$) of the sub-gate (G1) is isolated from the first metal connecting line (L1) by a dielectric material filled therebetween.

According to the present disclosure, when the radio frequency device is in the "on" state, a conducting channel in the epitaxial layer beneath the first auxiliary metal bulk ($G'_1$) is formed, where the channel resistance beneath the first auxiliary metal bulk ($G'_1$) is small, and thus is negligible.

When the radio frequency device is in the "off" state, the voltage (Vg) of the first auxiliary metal bulk ($G'_1$) is equal to a device turn-off voltage (in some cases, may also be referred to as a threshold voltage), and the conducting channel in the epitaxial layer beneath the first auxiliary metal bulk ($G'_1$) is closed. At this status, a channel resistance is formed beneath the first auxiliary metal bulk ($G'_1$), and could be considered equivalent to a resistor Rds1 which has one terminal connected to the source electrode and the other terminal connected to the drain electrode.

Figure 9:
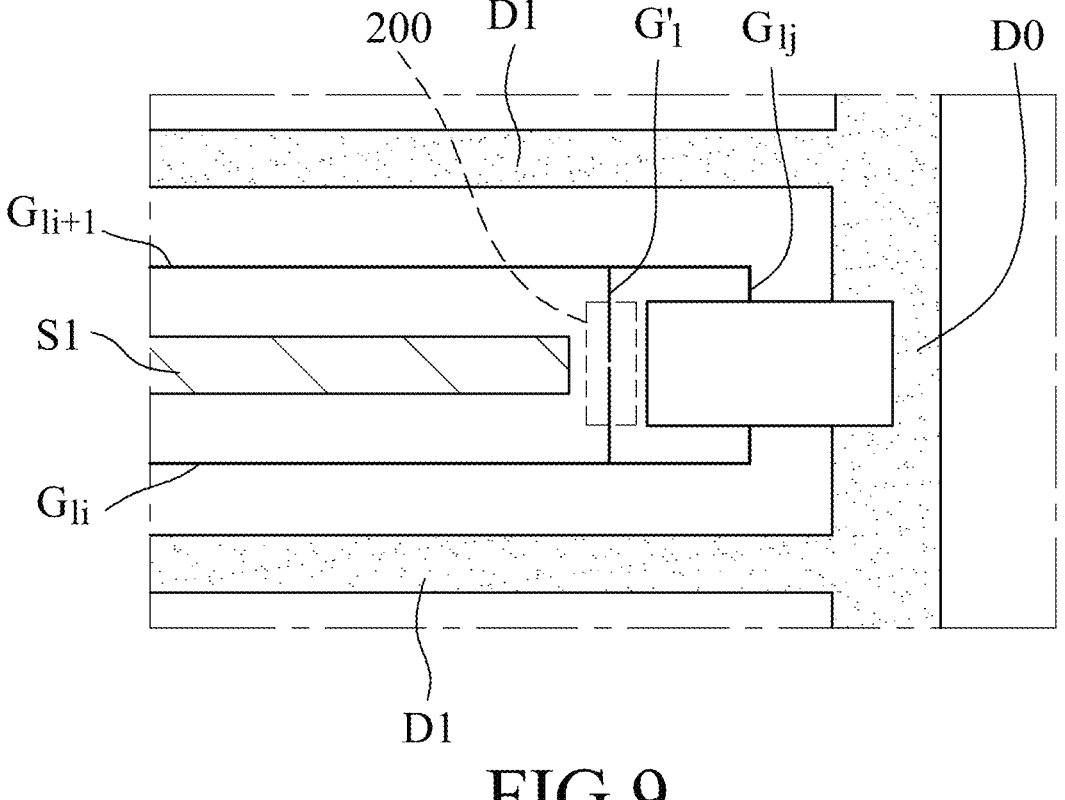
FIG. 9 is a schematic view showing a variation of the first embodiment.

In a variation of the first embodiment, as shown in dashed box 200 of FIG. 9, the first auxiliary metal bulk ($G'_1$) is formed with a gap between the two opposite ends thereof in the second direction, as seen in the dashed box 200. It should be noted that the gap may be formed anywhere in the first auxiliary metal bulk ($G'_1$) or may be located between one of the opposite ends and one of the corresponding adjacent two of the parallel portions ($G_{1i}$, $G_{1i+1}$) of the sub-gate (G1). The size of the gap is used for adjusting the resistance of Rds1 and is in the range of 0.05 μm to 1 μm in the second direction. When the radio frequency device is in the off state, more free electrons are generated in the area of the channel layer beneath the gap, resulting in a decrease in the channel resistance, i.e., the equivalent $R_{ds1}$ resistance becoming smaller. The larger the gap, the smaller the resistance of $R_{ds1}$. In this embodiment, the number of gaps is 1. In other embodiments, the number of gaps may be two or more.

Figure 10:
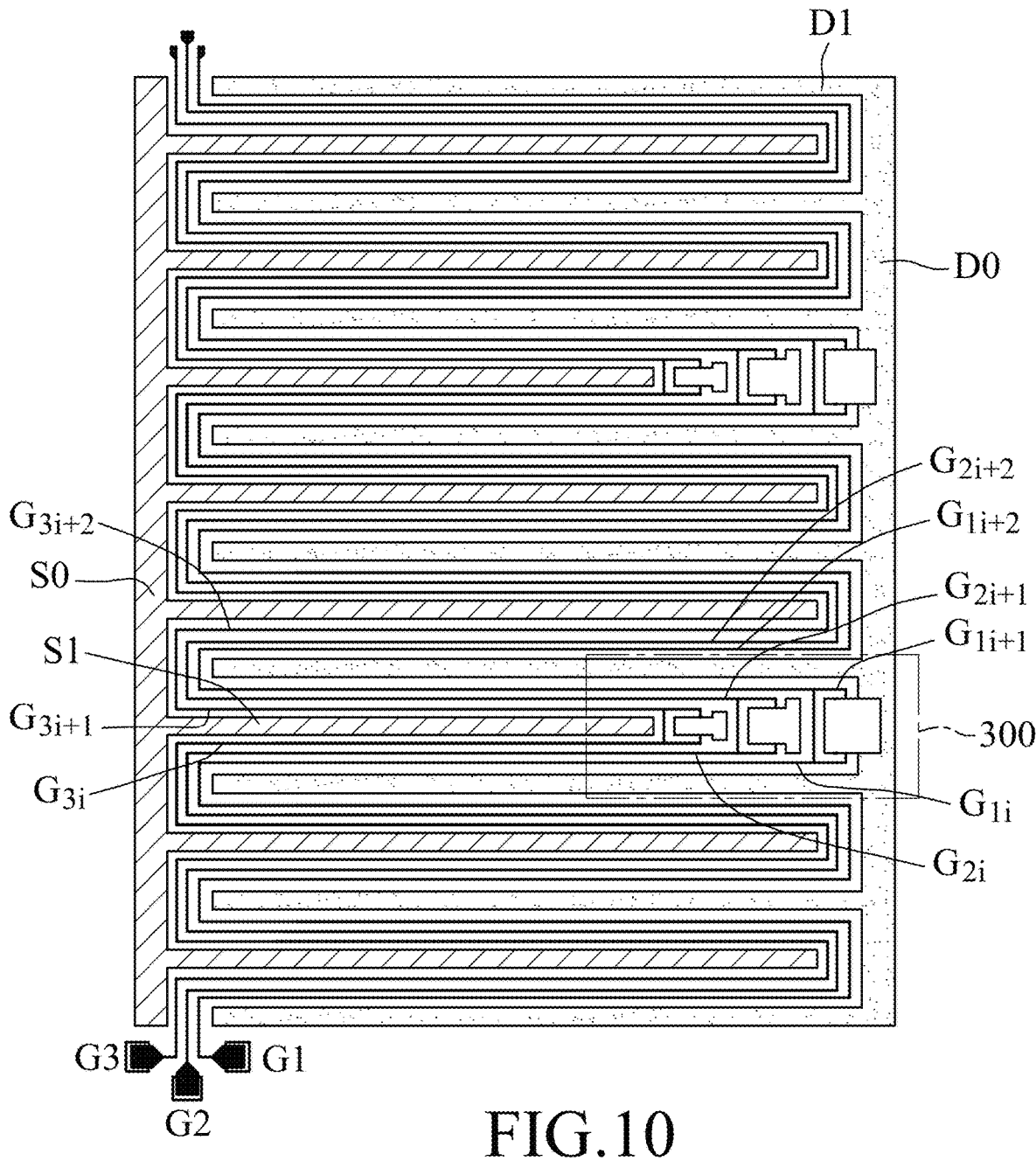
FIG. 10 is a schematic diagram illustrating a second embodiment of an RF device according to the present disclosure.

FIG. 10 illustrates a second embodiment of the RF device according to the present disclosure, which is a multi-gate RF device. In this embodiment, the RF device also includes a substrate 10, an epitaxial structure having a buffer layer 40, a channel layer 20, and a barrier layer 30, a source electrode, a drain electrode, and a gate structure. In this embodiment, the aforesaid elements have structures substantially the same as those in the first embodiment, except for the gate structure.

As described in the first embodiment, the source electrode includes a source electrode body (S0) and a plurality of parallel, spaced-apart source electrode fingers (S1) each extending in the first direction and connected to the source electrode body (S0). Similarly, the drain electrode includes a drain electrode body (D0) and a plurality of parallel, spaced-apart drain electrode fingers (D1) each extending in the first direction and connected to the drain electrode body (D0). The source electrode body (S0) and the drain electrode body (D0) are oppositely arranged in the first direction, the source electrode fingers (S1) and the drain electrode fingers (D1) are interdigitated between the source electrode body (S0) and the drain electrode body (D0) to form a serpentine channel therebetween. In certain embodiments, the source electrode fingers (S1) are evenly spaced apart from one another, and the drain electrode fingers (D1) are evenly spaced apart from one another.

In this embodiment, the gate structure includes a plurality of sub-gates that are disposed between the source electrode and the drain electrode. In the present embodiment, as shown in FIG. 10, the sub-gates include a first sub-gate (G1), a second sub-gate (G2), and a third sub-gate (G3) arranged in parallel and evenly spaced-apart from one another. The first sub-gate (G1) is farthest from the source electrode, the third sub-gate (G3) is closest to the source electrode S, and the second sub-gate (G2) is disposed between the first sub-gate (G1) and the third sub-gate (G3).

Similar to the first embodiment, in this embodiment, the first sub-gate (G1) includes a plurality of first parallel portions ($G_{1i}$, $G_{1i+1}$, $G_{1i+2}$ . . . ) each extending in the first direction, and a plurality of first vertical portions ($G_{1j}$) each extending in the second direction. The first parallel portions ($G_{1i}$, $G_{1i+1}$, $G_{1i+2}$ . . . ) and the first vertical portions ($G_{1j}$) are alternately connected to one another in series to form a serpentine shape and extend in the serpentine channel. Similar to the first sub-gate (G1), the second sub-gate (G2) includes a plurality of second parallel portions ($G_{2i}$, $G_{2i+1}$, $G_{2i+2}$ . . . ) and a plurality of second vertical portions ($G_{2j}$), which are alternately connected to one another in series to form a serpentine shape and extend in the serpentine channel; the third sub-gate (G3) includes a plurality of third parallel portions ($G_{3i}$, $G_{3i+1}$, $G_{3i+2}$ . . . ) and a plurality of third vertical portions ($G_{3j}$), which are alternately connected to one another in series to form a serpentine shape and extend in the serpentine channel.

Figure 11:
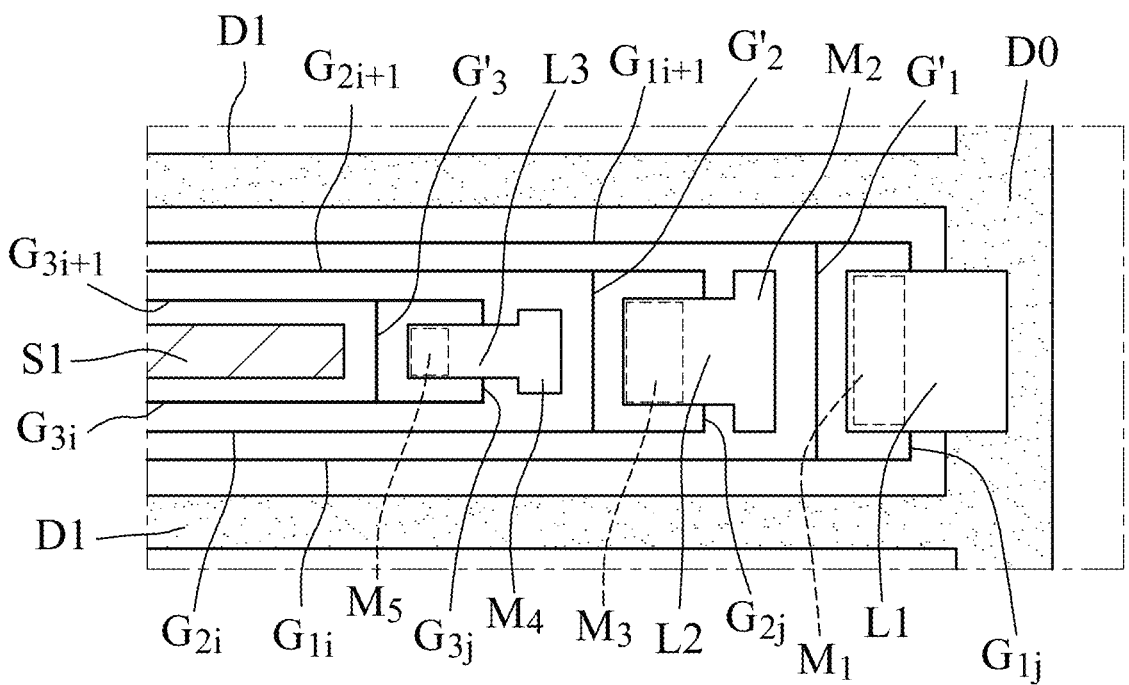
FIG. 11 is an enlarged schematic view illustrating a portion 300 shown in FIG. 10.

As shown in FIG. 11, one of the source electrode fingers (S1) is surrounded by corresponding adjacent two first parallel portions ($G_{1i}$, $G_{1i+1}$) of the first sub-gate (G1) and a corresponding one of the first vertical portions (G1') that interconnects the corresponding adjacent two first parallel portions ($G_{1i}$, $G_{1i+1}$). Further, the one of the source electrode fingers (S1) is also surrounded by corresponding adjacent two second parallel portions ($G_{2i}$, $G_{2i+1}$) of the second sub-gate (G2) and a corresponding one of the second vertical portions ($G_{2j}$) that interconnects the corresponding adjacent two second parallel portions ($G_{2i}$, $G_{2i+1}$), and is also surrounded by corresponding adjacent two third parallel portions ($G_{3i}$, $G_{3i+1}$) of the third sub-gate (G3) and a corresponding one of the third vertical portions ($G_{3j}$) that interconnects the corresponding adjacent two of the third parallel portions ($G_{3i}$, $G_{3i+1}$). In other words, the corresponding first vertical portion ($G_{1j}$) of the first sub-gate (G1) is disposed between the corresponding second vertical portion ($G_{2j}$) of the second sub-gate (G2) and the drain electrode body (D0); the corresponding second vertical portion ($G_{2j}$) of the second sub-gate (G2) is disposed between the corresponding third vertical portion ($G_{3j}$) of the third sub-gate (G3) and the corresponding first vertical portion ($G_{1j}$) of the first sub-gate (G1); the corresponding third vertical portion ($G_{3j}$) of the third sub-gate (G3) is disposed between the one of the source electrode fingers (S1) and the corresponding second vertical portion ($G_{2j}$) of the second sub-gate (G2).

In addition, the RF device further includes a first metal bulk ($M_1$), a first auxiliary metal bulk ($G'_1$), a second metal bulk ($M_2$), a second auxiliary metal bulk ($G'_2$), a third metal bulk ($M_3$), a third auxiliary metal bulk ($G'_3$), a fourth metal bulk ($M_4$), and a fifth metal bulk ($M_5$) all formed on the epitaxial structure.

The first auxiliary metal bulk ($G'_1$) is arranged between the corresponding adjacent two of the first parallel portions ($G_{1i}$, $G_{1i+1}$) of the first sub-gate (G1), and between the corresponding first vertical portion ($G_{1j}$) and the corresponding second vertical portions ($G_{2j}$). The first auxiliary metal bulk ($G'_1$) has two opposite ends respectively connected to the corresponding adjacent two of the first parallel portions ($G_{1i}$, $G_{1i+1}$) of the first sub-gate (G1).

The second auxiliary metal bulk ($G'_2$) is arranged between the corresponding adjacent two of the second parallel portions ($G_{2i}$, $G_{2i+1}$) of the second sub-gate (G2), and between the first auxiliary metal bulk ($G'_1$) and the corresponding third vertical portions ($G_{3j}$). The second auxiliary metal bulk ($G'_2$) has two opposite ends respectively connected to the corresponding adjacent two second parallel portions ($G_{2i}$, $G_{2i+1}$) of the second sub-gate (G2).

The third auxiliary metal bulk ($G'_3$) is arranged between corresponding adjacent two of the third parallel portions ($G_{3i}$, $G_{3i+1}$), and between an end of the one of the first electrode fingers (S1) and the corresponding third vertical portions ($G_{3j}$). The third auxiliary metal bulk ($G'_3$) has two opposite ends respectively connected to the corresponding adjacent two of the third parallel portions ($G_{3i}$, $G_{3i+1}$) of the third sub-gate (G3). Furthermore, the first auxiliary metal bulk ($G'_1$) has a first length in the second direction, the second auxiliary metal bulk ($G'_2$) has a second length in the second direction that is shorter than the first length of the first auxiliary metal bulk ($G'_1$), and the third auxiliary metal bulk ($G'_3$) has a third length in the second direction that is shorter than the second length of the second auxiliary metal bulk ($G'_2$).

As shown in FIG. 11, the first metal bulk ($M_1$) is positioned between the first auxiliary metal bulk ($G'_1$) and the corresponding one of the first vertical portions ($G_{1j}$), is electrically connected to the drain electrode body (D0) by a first metal connecting line (L1), and is electrically insulated from the first sub-gate (G1).

The second metal bulk ($M_2$) is disposed between the first auxiliary metal bulk ($G'_1$) and the corresponding second vertical portion ($G_{2j}$). The third metal bulk ($M_3$) is disposed between the second auxiliary metal bulk ($G'_2$) and the corresponding second vertical portion ($G_{2j}$). The second metal bulk ($M_2$) and the third metal bulk ($M_3$) are interconnected by a second metal connecting line (L2) and electrically insulated from the corresponding second vertical portion ($G_{2j}$). The fourth metal bulk ($M_4$) is disposed between the corresponding third vertical portion ($G_{3j}$) of the third sub-gate (G3) and the second auxiliary metal bulk ($G'_2$). The fifth metal bulk ($M_5$) is disposed between the third auxiliary metal bulk ($G'_3$) and the corresponding third vertical portion ($G_{3j}$) of the third sub-gate (G3). The fourth metal bulk ($M_4$) and the fifth metal bulk ($M_5$) are interconnected by a third metal connecting line (L3) and electrically insulated from the corresponding third vertical portion ($G_{3j}$).

The corresponding first vertical portion ($G_{1j}$) of the first sub-gate (G1) is isolated from the first metal connecting line (L1) by air. Alternatively, the corresponding first vertical portion ($G_{1j}$) of the first sub-gate (G1) is isolated from the first metal connecting line (L1) by a dielectric material filled therebetween. Similarly, the corresponding second vertical portions (G2) of the second sub-gate (G2) is isolated from the second metal connecting line (L2) by air or a dielectric material, and the third vertical portions ($G_{3j}$) of the third sub-gate (G3) is isolated from the third metal connecting line (L3) by air or a dielectric material.

When the radio frequency device is in the on state, a conducting channel in the epitaxial layer beneath the first auxiliary metal bulk ($G'_1$), the second auxiliary metal bulk ($G'_2$), and the third auxiliary metal bulk ($G'_3$) is formed, where the channel resistances beneath the first auxiliary metal bulk ($G'_1$), the second auxiliary metal bulk ($G'_2$), and the third auxiliary metal bulk ($G'_3$) are all small, and thus are negligible.

When the radio frequency device is in the off state, the voltages (Vgs) of the first auxiliary metal bulk ($G'_1$), the second auxiliary metal bulk ($G'_2$), and the third auxiliary metal bulk ($G'_3$) are all equal to a device turn-off voltage (in some cases, this may also be referred to as a threshold voltage), and the conducting channel in the epitaxial layer beneath the first auxiliary metal bulk ($G'_1$), the second auxiliary metal bulk ($G'_2$), and the third auxiliary metal bulk ($G'_3$) is closed. At this status, channel resistances are formed beneath the first auxiliary metal bulk ($G'_1$), the second auxiliary metal bulk ($G'_2$), and the third auxiliary metal bulk ($G'_3$), respectively, and could be considered equivalent to resistors $R_{ds1}$, $R_{ds2}$, and $R_{ds3}$ which are connected in series with one terminal of the resistor $R_{ds1}$ connected to the drain electrode and one terminal of the resistor $R_{ds3}$ connected to the source electrode.

As shown in FIG. 10, the RF device may further include another first metal bulk ($M_1$), another first auxiliary metal bulk ($G'_1$), another second metal bulk ($M_2$), another second auxiliary metal bulk ($G'_2$), another third metal bulk ($M_3$), another third auxiliary metal bulk ($G'_3$), another fourth metal bulk ($M_4$), and another fifth metal bulk ($M_5$) which are disposed between a corresponding source electrode finger (S1) and the drain electrode body (D0) and are arranged in a manner the same as the aforesaid.

Figure 12:
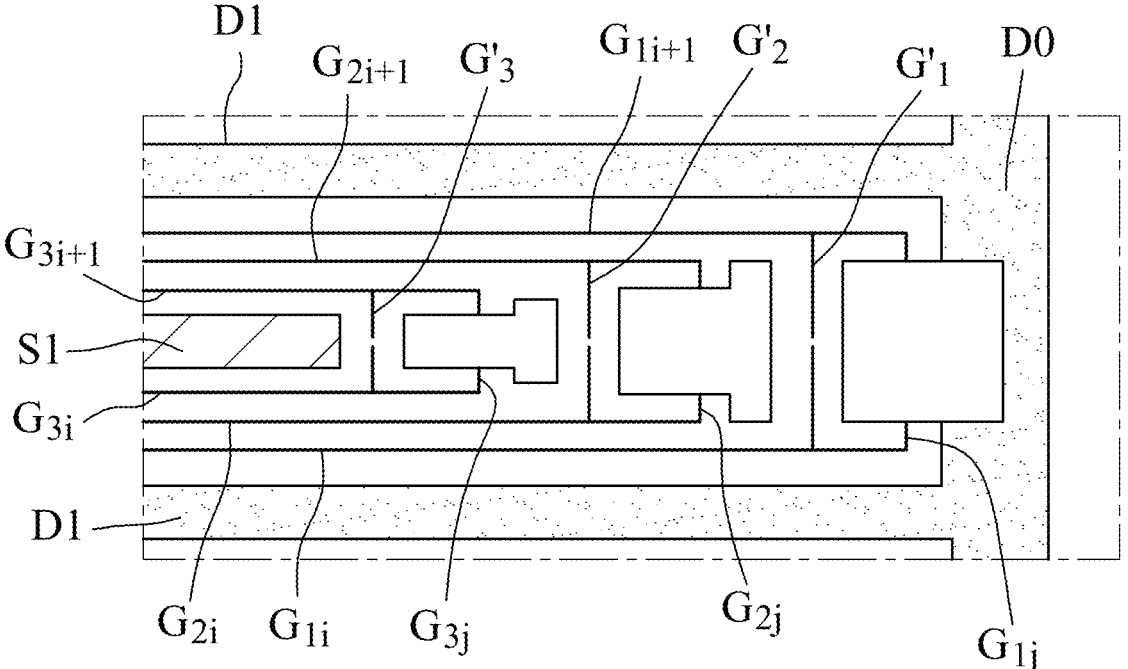
FIG. 12 is a schematic view showing a variation of the second embodiment.

In a variation of the second embodiment, as shown in FIG. 12, the first auxiliary metal bulk ($G'_1$) is formed with a gap between two ends thereof (similar to the variation shown in FIG. 9). To be specific, in this embodiment, the two ends of the first auxiliary metal bulk ($G'_1$) are opposite in the second direction, and the gap may be formed anywhere in the first auxiliary metal bulk ($G'_1$) or between one of the two ends of the first auxiliary metal bulk ($G'_1$) and one of the corresponding adjacent two of the first parallel portions ($G_{1i}$, $G_{1i+1}$) of the first sub-gate (G1). The size of the gap is used for adjusting the resistance of $R_{ds1}$, and is in the range of 0.05 μm to 1 μm (e.g., 0.1 μm). In a certain embodiment, the number of gaps is 1.

Similarly, the second auxiliary metal bulk ($G'_2$) is formed with a gap between two ends thereof that are opposite in the second direction. The gap may be formed anywhere in the second auxiliary metal bulk ($G'_2$) or between one of the two ends of the second auxiliary metal bulk ($G'_2$) and one of the corresponding adjacent two of the second parallel portions ($G_{2i}$, $G_{2i+1}$) of the second sub-gate (G2). The size of the gap is used for adjusting the resistance of $R_{ds2}$, and is in the range of 0.05 μm to 1 μm (e.g., 0.1 μm). In a certain embodiment, the number of gaps is 1.

Similarly, the third auxiliary metal bulk ($G'_3$) is formed with a gap between two ends thereof that are opposite in the second direction. The gap may be formed anywhere in the third auxiliary metal bulk ($G'_3$) or between one of the two ends of the third auxiliary metal bulk ($G'_3$) and one of the corresponding adjacent two of the parallel portions ($G_{3i}$, $G_{3i+1}$) of the third sub-gate (G3). The size of the gap is used for adjusting the resistance of $R_{ds3}$, and is in the range of 0.05 μm to 1 μm (e.g., 0.1 μm). In a certain embodiment, the number of gaps is 1.

It should be noted that, in this variation, it is not necessary to form the gap in each of the first, second and third auxiliary metal bulk ($G'_1$, $G'_2$, $G'_3$). That is, the gap(s) may be formed in one or two of the first, second and third auxiliary metal bulk ($G'_1$, $G'_2$, $G'_3$).

Figure 3:
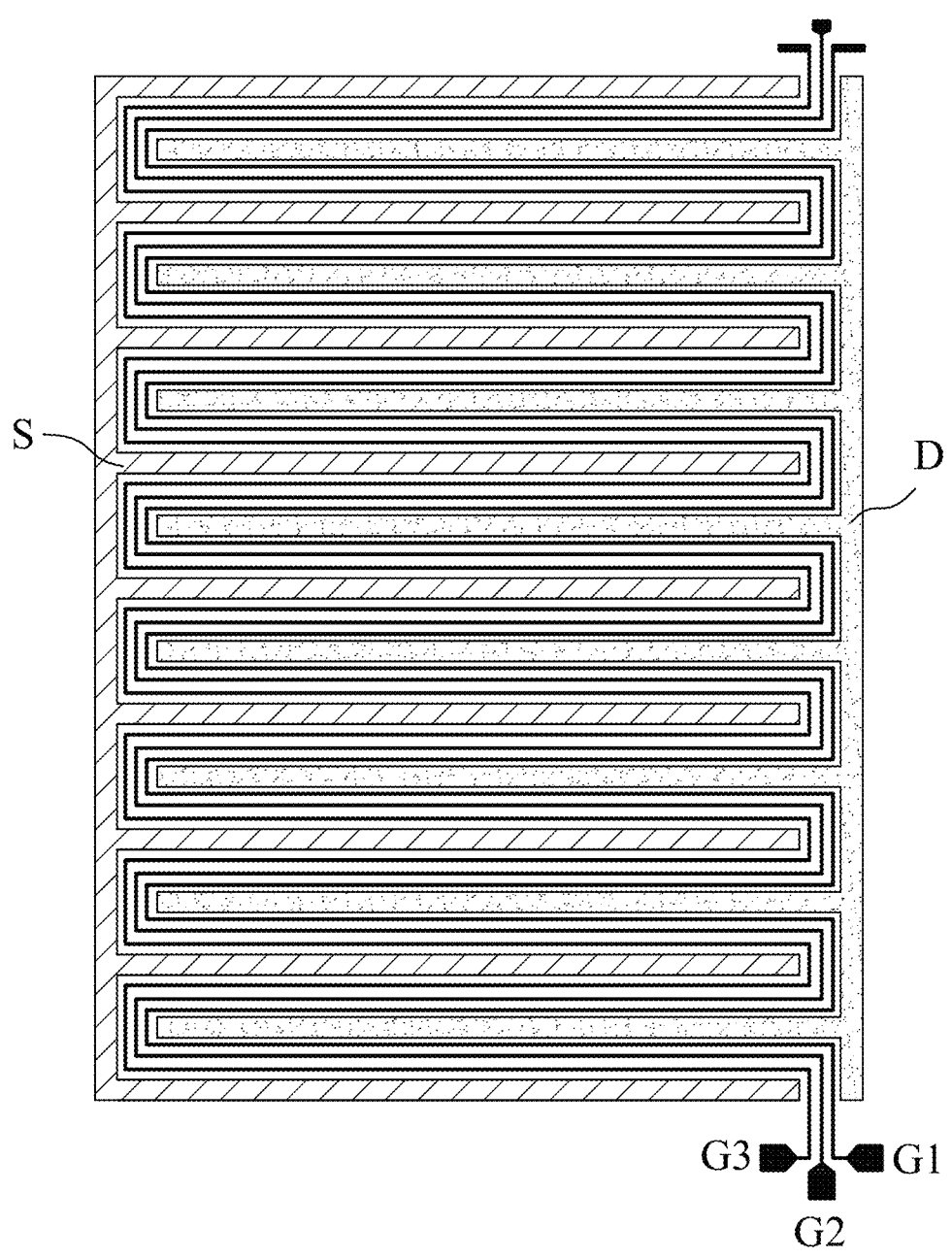
FIG. 3 is a schematic diagram illustrating a layout structure of a conventional multi-gate radio frequency (RF) device.
Figure 4:
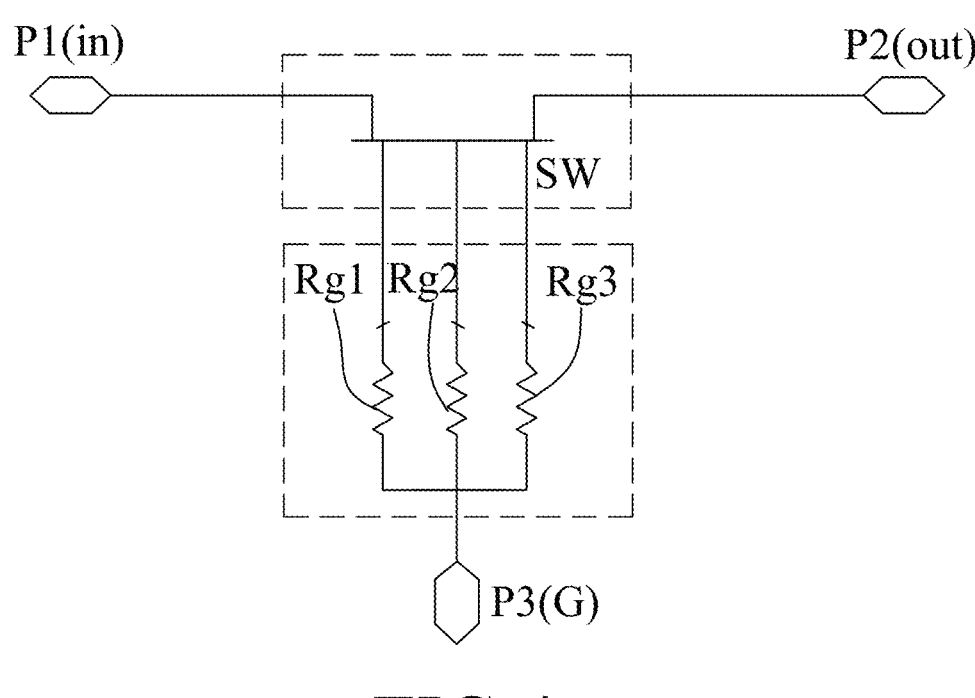
FIG. 4 is a schematic diagram illustrating a circuit of a conventional multi-gate RF device.
Figure 5:
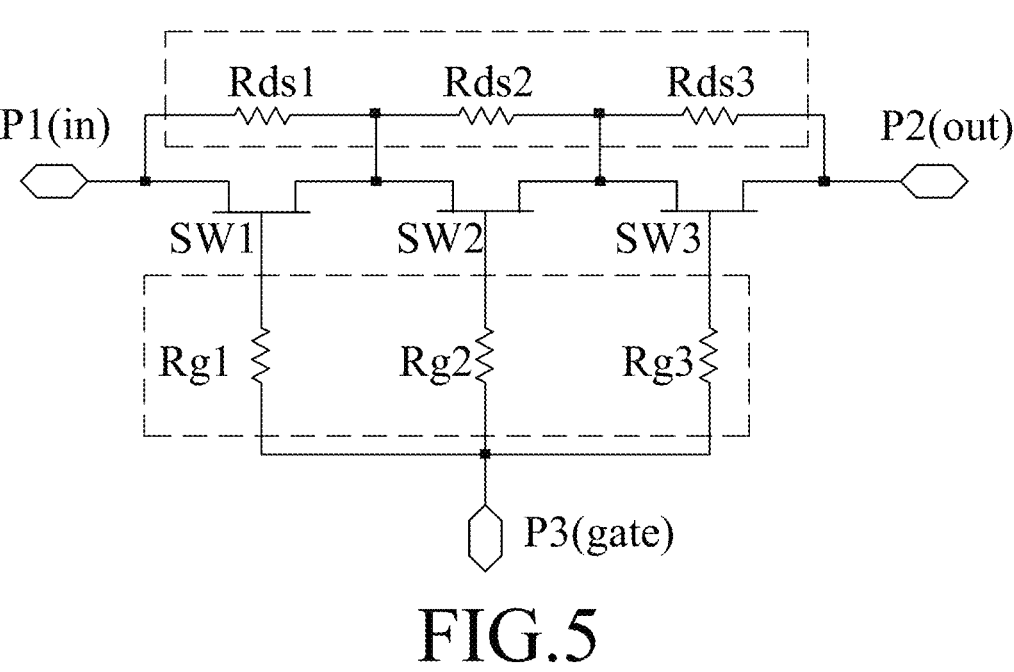
FIG. 5 is a schematic diagram illustrating a circuit of a conventional multi-gate RF device, which incorporates Rds resistors having high resistances to connect area(s) between two gates and input and output ports of the conventional multi-gate RF device.
Figure 13:
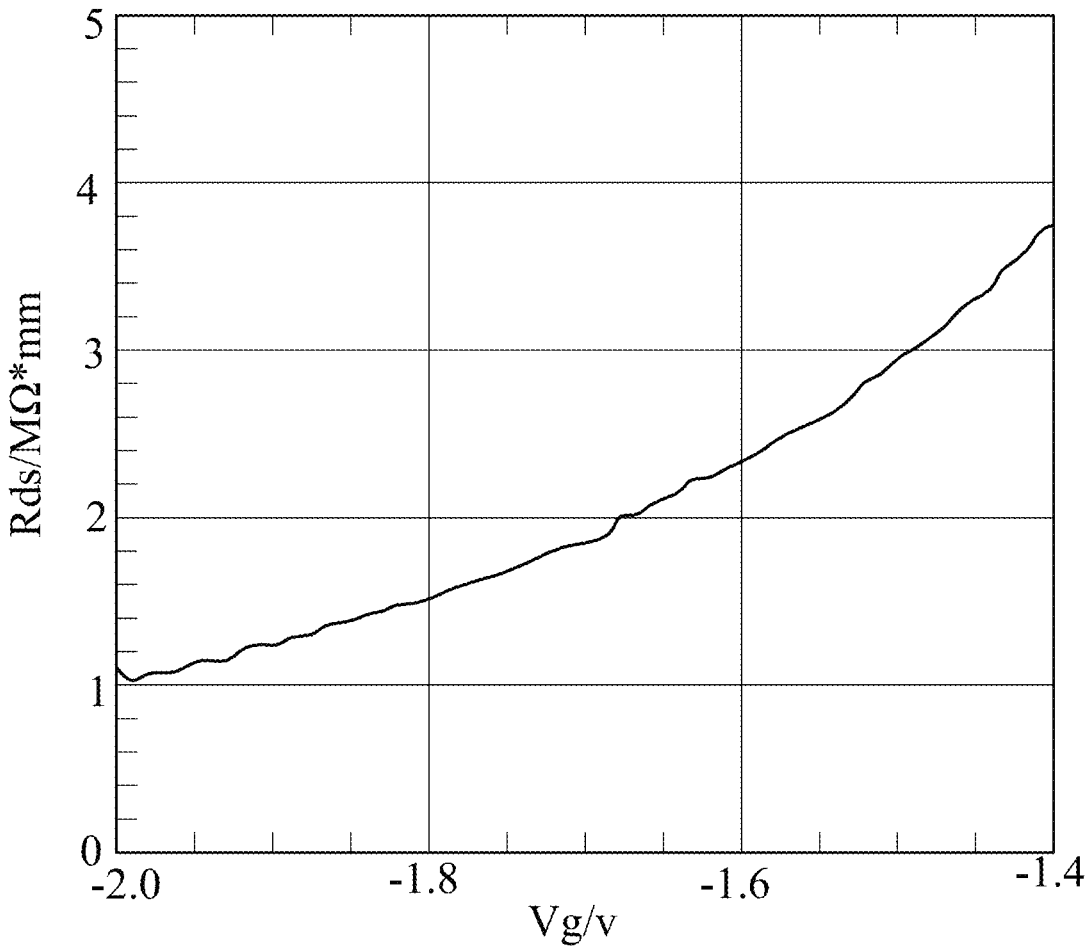
FIG. 13 is a graph illustrating a relationship between channel resistance and gate voltage of the RF device of the embodiment shown in FIG. 12.
Figure 14:
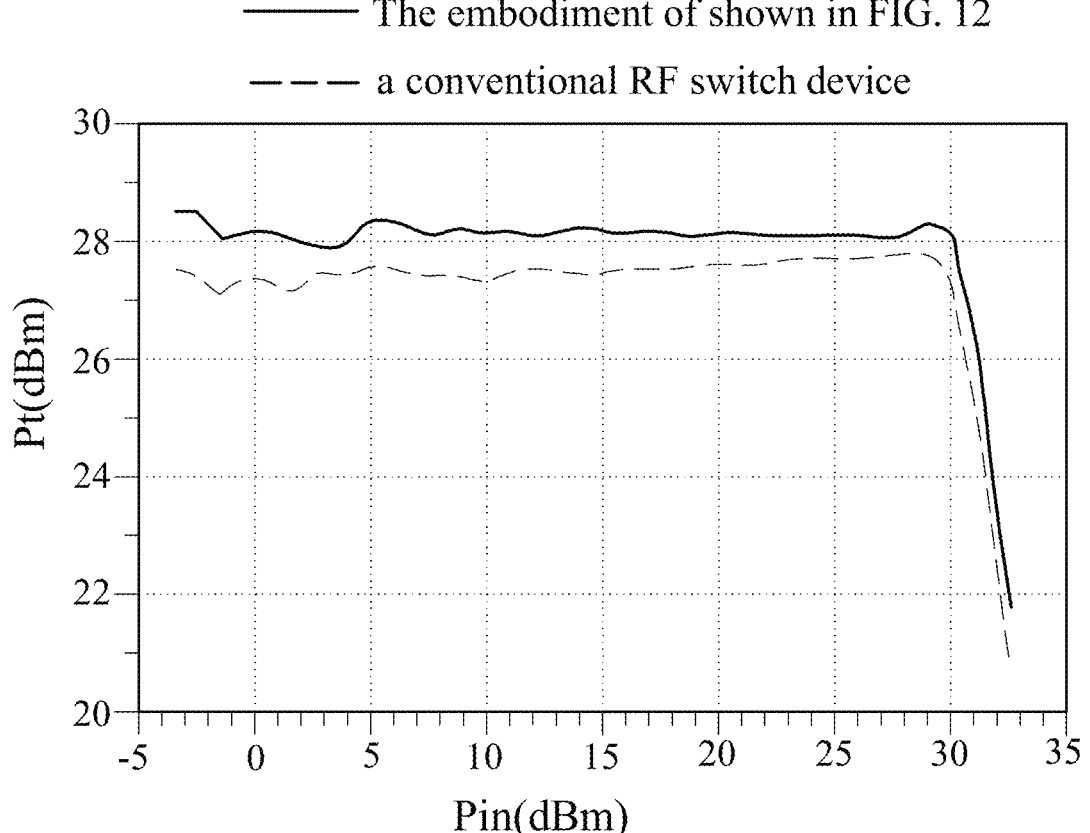
FIG. 14 is a graph illustrating the power handling capability of the RF device of the embodiment shown in FIG. 12 and a conventional RF device.

FIG. 13 is a graph illustrating the relationship between the measured channel resistances and gate voltages of the RF device shown in FIG. 12. It is noted that in the off state (i.e., Vg=−2V), the channel resistance is about 1 MΩ*mm, which meets the magnitude requirement for an Rds resistor. The function of the Rds resistors for stabilizing the voltage within the gate structures is achieved by the channel resistance formed and embedded within the multi-gate RF device, thus saving layout space. FIG. 14 is a graph illustrating the power handling capability of the RF device of the embodiment shown in FIG. 12 compared to that of a conventional RF device shown in FIG. 3. The design of the RF device of the present disclosure has improved power handling capability.

Figure 15:
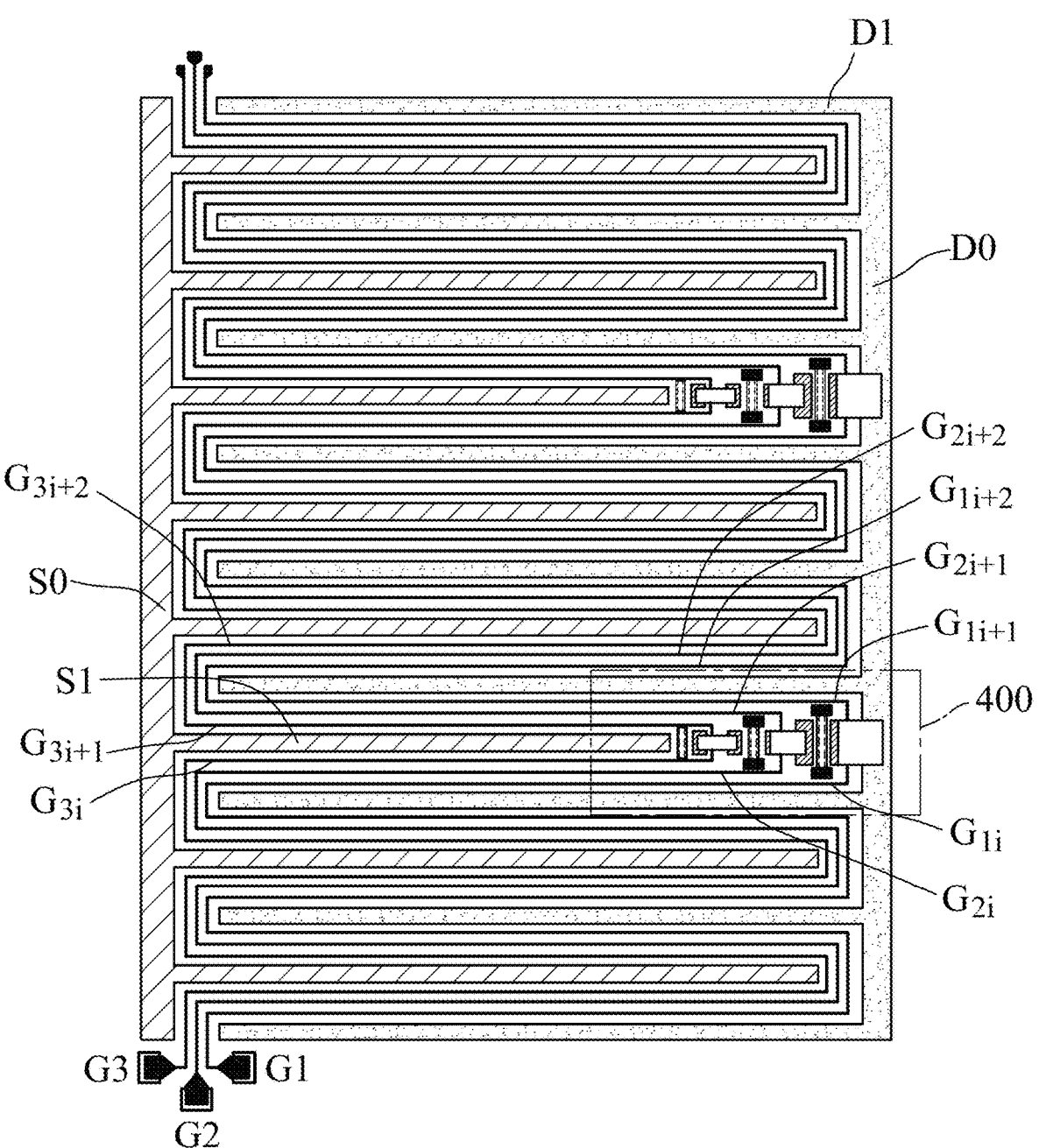
FIG. 15 is a schematic diagram illustrating a third embodiment of an RF device according to the present disclosure.
Figures 16, 17:
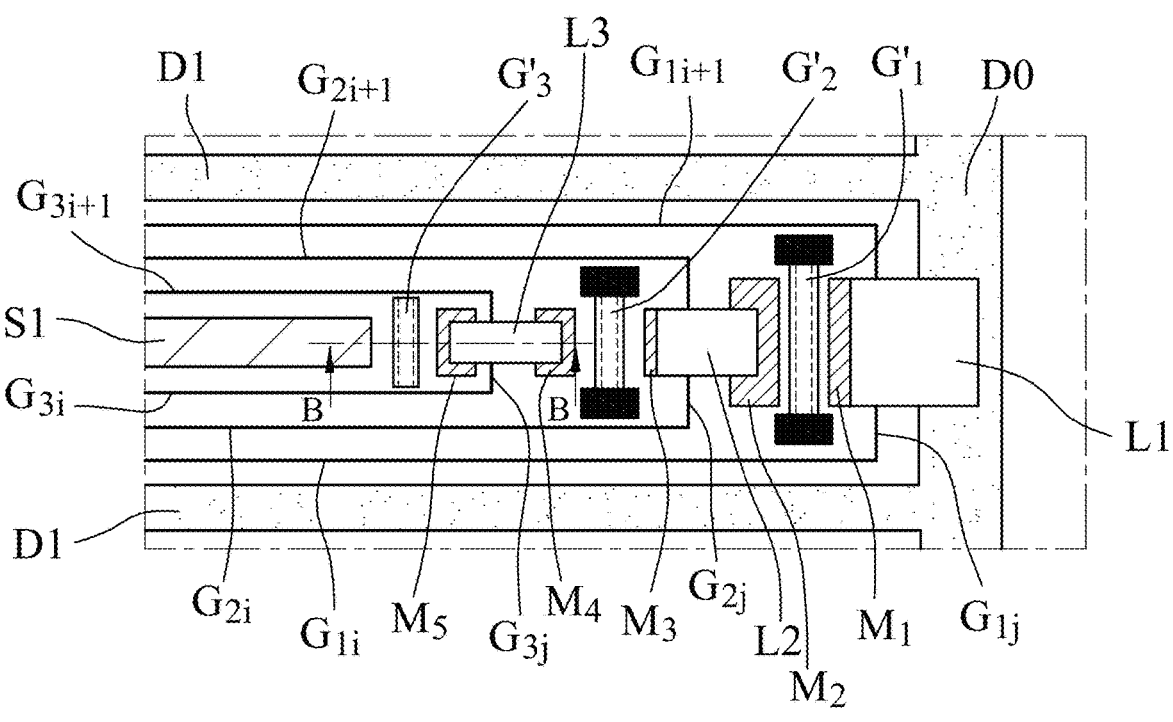
FIG. 16 is an enlarged schematic view illustrating a portion 400 shown in FIG. 15.
FIG. 17 is a schematic sectional view taken along line B-B in FIG. 16.

Referring to FIGS. 15 to 17, a third embodiment of the RF device of the present disclosure discloses a multi-gate RF device that includes a layout structure similar to that of the second embodiment, except for the structure of the first auxiliary metal bulk ($G'_1$), the second auxiliary metal bulk ($G'_2$) and the third auxiliary metal bulk ($G'_3$). To be specific, in the second embodiment, the two opposite ends of the first auxiliary metal bulk ($G'_1$), the two opposite ends of the second auxiliary metal bulk ($G'_2$) and the two opposite ends of the third auxiliary metal bulk ($G'_3$) are respectively connected to the corresponding adjacent two first parallel portions ($G_{1i}$, $G_{1i+1}$) of the first sub-gate (G1), the corresponding adjacent two second parallel portions ($G_{2i}$, $G_{2i+1}$) of the second sub-gate (G2), and the corresponding adjacent two of the third parallel portions ($G_{3i}$, $G_{3i+1}$) of the third sub-gate (G3). However, in the third embodiment, as shown in FIG. 15, each of the two opposite ends of the first auxiliary metal bulk ($G'_1$) forms a gap in the range of 0.05 μm to 1 μm with each of the corresponding adjacent two of the first parallel portions ($G_{1i}$, $G_{1i+1}$) of the first sub-gate (G1); each of the two opposite ends of the second auxiliary metal bulk ($G'_2$) forms a gap in the range of 0.05 μm to 1 μm with each of the corresponding adjacent two of the second parallel portions ($G_{2i}$, $G_{2i+1}$) of the second sub-gate (G2); and each of the two opposite ends of the third auxiliary metal bulk ($G'_3$) forms a gap in the range of 0.05 μm to 1 μm with each of the corresponding adjacent two of the third parallel portions ($G_{3i}$, $G_{3i+1}$) of the third sub-gate (G3). The size(s) of the gap(s) may be designed to adjust the Rds resistance that varies depending on the input power of the RF device, thereby improving the "off" performance of the RF device.

In the present embodiment, the first auxiliary metal bulk ($G'_1$), the second auxiliary metal bulk ($G'_2$), and the third auxiliary metal bulk ($G'_3$) each has a T-shaped configuration in a cross-section along the first direction, as shown in the schematic sectional view of the third auxiliary metal bulk ($G'_3$) of FIG. 17.

Moreover, for each of the first auxiliary metal bulk ($G'_1$), the second auxiliary metal bulk ($G'_2$), and/or the third auxiliary metal bulk ($G'_3$), widths measured in the first direction at the opposite ends thereof are greater than a width at a middle portion between the opposite ends thereof.

It should be noted that, although the embodiments of the present disclosure have disclosed the radio frequency device with the single sub-gate and the radio frequency device with the three sub-gates, a radio frequency device with two sub-gates and a layout structure thereof may be easily obtained according to the embodiments of the present disclosure, also included is a radio frequency device with four or more sub-gates and a layout structure thereof, and all of which are within the scope of the disclosure.

It should be noted that, in the first and second embodiments, the auxiliary metal bulks may also have a T-shaped configuration in a cross-section along the first direction. The above embodiments are only illustrated as examples for a radio frequency layout structure and a radio frequency device of the present disclosure. However, the present disclosure is not limited to the disclosed embodiments. Any simple amendments, equivalent variations and modifications made to the above embodiments according to the essential technical features of the present disclosure falls within the scope of the present disclosure solutions.

This disclosure also provide a layout structure of a radio frequency device which includes the structure and arrangement shown in the first embodiment, the second embodiment, the third embodiment, or the variations thereof. This disclosure also provide a radio frequency front-end apparatus including at least one of the aforesaid radio frequency devices.

In the description above, for the purposes of explanation, numerous specific details have been set forth in order to provide a thorough understanding of the embodiment(s). It will be apparent, however, to one skilled in the art, that one or more other embodiments may be practiced without some of these specific details. It should also be appreciated that reference throughout this specification to "one embodiment," "an embodiment," an embodiment with an indication of an ordinal number and so forth means that a particular feature, structure, or characteristic may be included in the practice of the disclosure. It should be further appreciated that in the description, various features are sometimes grouped together in a single embodiment, figure, or description thereof for the purpose of streamlining the disclosure and aiding in the understanding of various inventive aspects; such does not mean that every one of these features needs to be practiced with the presence of all the other features. In other words, in any described embodiment, when implementation of one or more features or specific details does not affect implementation of another one or more features or specific details, said one or more features may be singled out and practiced alone without said another one or more features or specific details. It should be further noted that one or more features or specific details from one embodiment may be practiced together with one or more features or specific details from another embodiment, where appropriate, in the practice of the disclosure.

While the disclosure has been described in connection with what are considered the exemplary embodiments, it is understood that this disclosure is not limited to the disclosed embodiments but is intended to cover various arrangements included within the spirit and scope of the broadest interpretation so as to encompass all such modifications and equivalent arrangements.

What is claimed is:

1. A radio frequency device, comprising:
   a substrate;
   an epitaxial structure including a buffer layer, a channel layer, and a barrier layer that are disposed on said substrate in such order;

a first electrode formed on said epitaxial structure and including a first electrode body and a plurality of parallel, spaced-apart first electrode fingers each extending in a first direction and connected to said first electrode body;

a second electrode formed on said epitaxial structure, and including a second electrode body and a plurality of parallel, spaced-apart second electrode fingers each extending in the first direction and connected to said second electrode body, said first electrode body and said second electrode body being oppositely arranged in the first direction, said first electrode fingers and said second electrode fingers being interdigitated between said first electrode body and said second electrode body to form a serpentine channel therebetween;

a gate structure including a first sub-gate that is formed on said epitaxial structure, that is disposed between said first electrode and said second electrode, and that has multiple first parallel portions each extending in the first direction and multiple first vertical portions each extending in a second direction perpendicular to the first direction, said first parallel portions and said first vertical portions being alternately connected to one another in series to form a serpentine shape and extending in said serpentine channel;

a first metal bulk formed on said epitaxial structure;

a first auxiliary metal bulk formed on said epitaxial structure; and a first metal connection line electrically connecting said first metal bulk to said second electrode body and electrically insulated from said first sub-gate;

said first auxiliary metal bulk and said first metal bulk being arranged between corresponding adjacent two of said first parallel portions of said first sub-gate and between a corresponding one of said first vertical portions that interconnects the corresponding adjacent two of said first parallel portions and an end of a corresponding one of said first electrode fingers that is surrounded by the corresponding adjacent two of said first parallel portions and the corresponding one of first vertical portions, the end of the corresponding one of said first electrode fingers being distal from said first electrode body, said first metal bulk being positioned between said first auxiliary metal bulk and the corresponding one of said first vertical portions, one of said first electrode and said second electrode serving as a drain electrode and the other as a source electrode.

2. The radio frequency device according to claim 1, wherein said first auxiliary metal bulk has two opposite ends respectively connected to the corresponding adjacent two of said first parallel portions of said first sub-gate.

3. The radio frequency device according to claim 2, wherein said first auxiliary metal bulk is formed with a gap between the opposite ends.

4. The radio frequency device according to claim 3, wherein said gap is in a range from 0.05 μm to 1 μm.

5. The radio frequency device according to claim 1, wherein said first auxiliary metal bulk has two opposite ends in the second direction, and a gap is formed between one of the opposite ends and one of the corresponding adjacent two of said first parallel portions of said first sub-gate.

6. The radio frequency device according to claim 5, wherein said gap is in a range from 0.05 μm to 1 μm.

7. The radio frequency device according to claim 1, further comprising:

a second metal bulk disposed on said epitaxial structure;

a second auxiliary metal bulk disposed on said epitaxial structure;

a third metal bulk disposed on said epitaxial structure; and a second metal connecting line;

wherein said gate structure further includes a second sub-gate that is disposed between said first electrode and said first sub-gate, that has multiple second parallel portions each extending in the first direction and multiple second vertical portions each extending in the second direction, said second parallel portions and said second vertical portions being alternately connected to one another in series to form a serpentine shape and extending in said serpentine channel, said second auxiliary metal bulk, said second metal bulk and said third metal bulk are arranged between corresponding adjacent two of said second parallel portions of said second sub-gate, and between said first auxiliary metal bulk and an end of one of said first electrode fingers that corresponds to said first auxiliary metal bulk, said second auxiliary metal bulk is disposed between the end of said one of said first electrode fingers that corresponds to said first auxiliary metal bulk and a corresponding one of said second vertical portions that interconnects the corresponding adjacent two of said second parallel portions, said second metal bulk is disposed between said first auxiliary metal bulk and one of said second vertical portions that corresponds to said second auxiliary metal bulk, said third metal bulk is disposed between said second auxiliary metal bulk and said one of said second vertical portions that corresponds to said second auxiliary metal bulk, and said second metal bulk and said third metal bulk are interconnected by said second metal connecting line and electrically insulated from said one of said second vertical portions that corresponds to said second auxiliary metal bulk.

8. The radio frequency device according to claim 7, wherein said second auxiliary metal bulk has two opposite ends respectively connected to the corresponding adjacent two of said second parallel portions of said second sub-gate.

9. The radio frequency device according to claim 8, wherein said second auxiliary metal bulk is formed with a gap between the opposite ends.

10. The radio frequency device according to claim 9, wherein said gap is in a range from 0.05 μm to 1 μm.

11. The radio frequency device according to claim 9, wherein said first auxiliary metal bulk has a first length in the second direction, said second auxiliary metal bulk has a second length in the second direction that is shorter than the first length of said first auxiliary metal bulk, and said third auxiliary metal bulk has a third length in the second direction that is shorter than the second length of said second auxiliary metal bulk.

12. The radio frequency device according to claim 9, wherein said first auxiliary metal bulk, said second auxiliary metal bulk, and said third auxiliary metal bulk each has a T-shaped configuration in a cross-section along the first direction.

13. The radio frequency device according to claim 7, wherein said second auxiliary metal bulk has two opposite ends in the second direction, and a gap is formed between one of the opposite ends and one of the corresponding adjacent two of said second parallel portions of said second sub-gate.

14. The radio frequency device according to claim 13, wherein said gap is in a range from 0.05 μm to 1 μm.

15. The radio frequency device according to claim 7, further comprising:

a third auxiliary metal bulk disposed on said epitaxial structure;

wherein said gate structure further includes a third sub-gate that is disposed between said first electrode and said second sub-gate, that has multiple third parallel portions each extending in the first direction and multiple third vertical portions each extending in the second direction, said third parallel portions and said third vertical portions being alternately connected to one another in series to form a serpentine shape and extending in said serpentine channel;

said third auxiliary metal bulk is arranged between corresponding adjacent two of said third parallel portions, and between an end of one of said first electrode fingers that corresponds to said first auxiliary metal bulk and a corresponding one of said third vertical portion that interconnects the corresponding adjacent two of said third parallel portions.

16. The radio frequency device according to claim 15, further comprising:

a fourth metal bulk disposed between the corresponding third vertical portion of said third sub-gate and said second auxiliary metal bulk;

a fifth metal bulk disposed between said third auxiliary metal bulk and the corresponding third vertical portion of said third sub-gate; and a third metal connecting line;

wherein said fourth metal bulk and said fifth metal bulk are interconnected by said third metal connecting line and electrically insulated from said one of said third vertical portion that corresponds to said third auxiliary metal bulk.

17. The radio frequency device according to claim 15, wherein said third auxiliary metal bulk has two opposite ends respectively connected to the corresponding adjacent two of said third parallel portions of said third sub-gate.

18. The radio frequency device according to claim 17, wherein said third auxiliary metal bulk is formed with a gap between the opposite ends.

19. The radio frequency device according to claim 15, wherein said third auxiliary metal bulk has two opposite ends in the second direction, and a gap is formed between one of the opposite ends and one of the corresponding adjacent two of said third parallel portions of said third sub-gate.

20. A radio frequency front-end apparatus, comprising a radio frequency device as claimed in claim 1.

* * * * *